United States Patent
Gaddam et al.

(10) Patent No.: US 7,782,645 B1
(45) Date of Patent: Aug. 24, 2010

(54) SELECTIVE ENCODING OF DATA VALUES FOR MEMORY CELL BLOCKS

(75) Inventors: Venkat Rajendher Reddy Gaddam, Sunnyvale, CA (US); Rajagopal Krishnaswamy, San Jose, CA (US); Vinay Raja Iyengar, Cupertino, CA (US)

(73) Assignee: Netlogic Microsystems, Inc., Santa Clara, CA (US)

( * ) Notice: Subject to any disclaimer, the term of this patent is extended or adjusted under 35 U.S.C. 154(b) by 124 days.

(21) Appl. No.: 12/012,660

(22) Filed: Feb. 4, 2008

(51) Int. Cl.
*G11C 15/00* (2006.01)
(52) U.S. Cl. .................. 365/49.17; 365/49.1
(58) Field of Classification Search ............ 365/49.1, 365/49.17, 49.16, 49.11, 49.18
See application file for complete search history.

(56) References Cited

U.S. PATENT DOCUMENTS

| | | | |
|---|---|---|---|
| 6,243,281 B1 * | 6/2001 | Pereira | ............ 365/49.1 |
| 6,324,087 B1 | 11/2001 | Pereira | |
| 6,542,391 B2 | 4/2003 | Pereira et al. | |
| 6,795,325 B1 | 9/2004 | Inoue | |
| 6,804,134 B1 | 10/2004 | Proebsting et al. | |
| 6,831,850 B2 | 12/2004 | Pereira et al. | |
| 6,967,855 B2 | 11/2005 | Srinivasan et al. | |
| 6,993,622 B2 | 1/2006 | Khanna et al. | |
| 7,133,302 B1 | 11/2006 | Srinivasan et al. | |
| 2007/0064461 A1 | 3/2007 | Srinivasan et al. | |

* cited by examiner

*Primary Examiner*—Huan Hoang
*Assistant Examiner*—Jay Radke
(74) *Attorney, Agent, or Firm*—Haverstock & Owens, LLP

(57) ABSTRACT

An integrated circuit device can include a plurality of configuration storage locations each comprising at least one encoding field. Each encoding field can selectively enable at least one received data value to be encoded into an encoded data value prior to being applied to a corresponding block of the integrated circuit device. Each block can comprise a plurality of content addressable memory (CAM) cells.

21 Claims, 6 Drawing Sheets

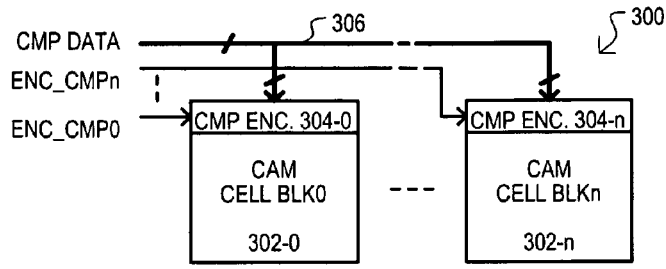
FIG. 3A
FIG. 3B
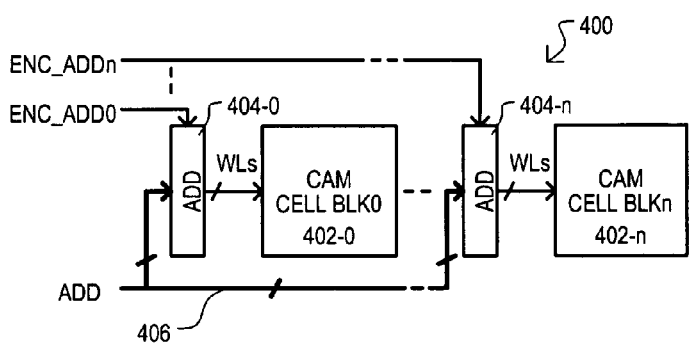
FIG. 4A
FIG. 4B
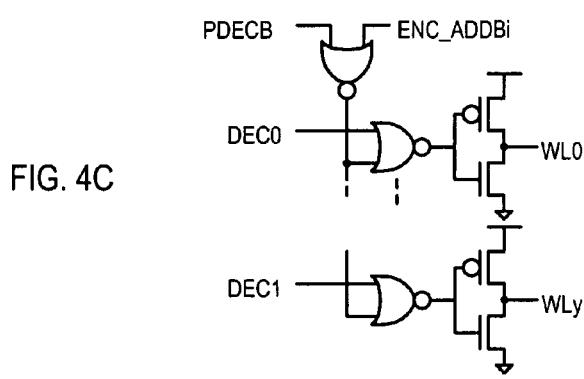
FIG. 4C
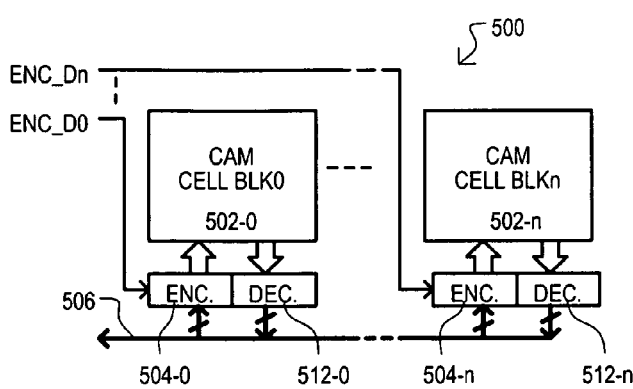
FIG. 5A
FIG. 5B

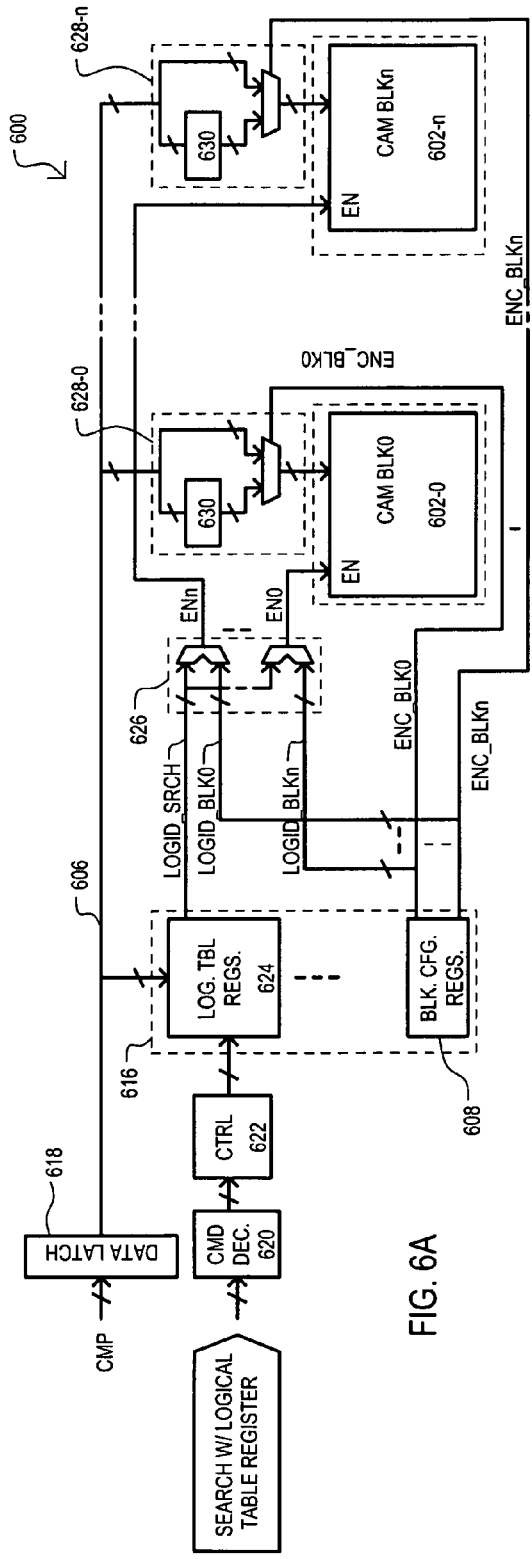
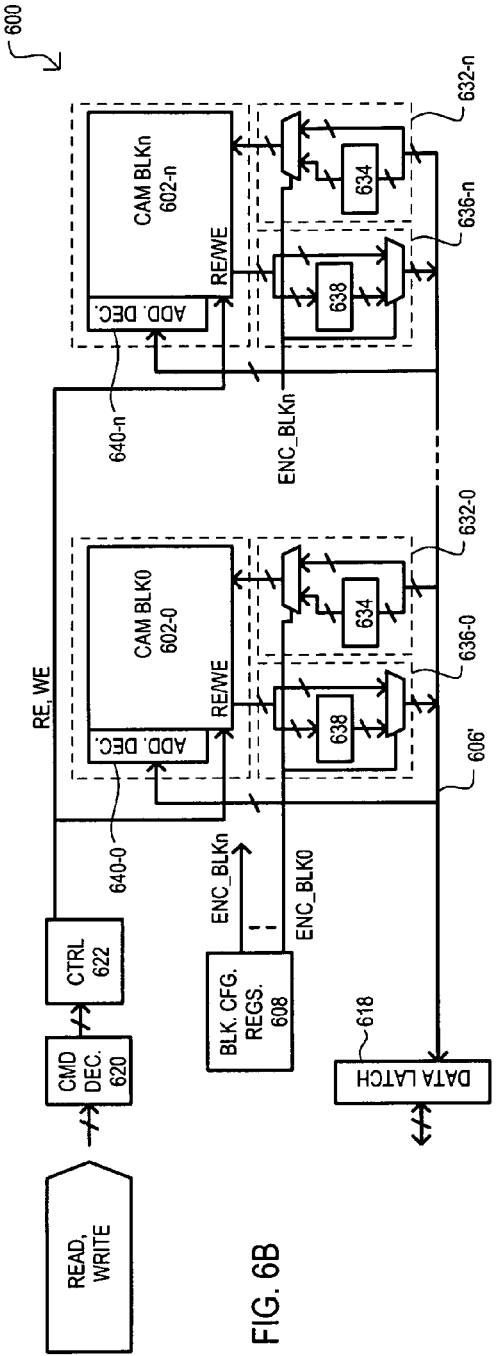
FIG. 6A
FIG. 6B

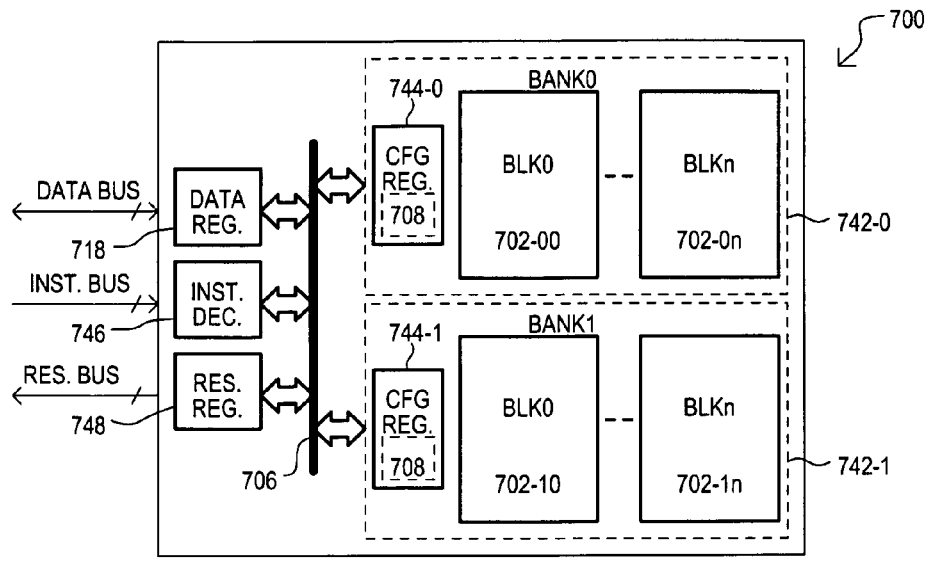

| CFG. REG. | | |
|---|---|---|
| REGISTER TYPE | BANK | ADDRESS |
| ⋮ | | |
| LOGICAL TABLE REGISTER | 0 | 005F:0040 |
| BLOCK CONFIGURATION REGISTER | 0 | 008F:0080 |
| ⋮ | | |
| LOGICAL TABLE REGISTER | 1 | 005F:0040 |
| BLOCK CONFIGURATION REGISTER | 1 | 008F:0080 |
| ⋮ | | |

| LOGICAL TABLE REGISTER | |
|---|---|
| BIT | DESCRIPTION |
| 31:14 | OTHER |
| 13:9 | LOGICAL TABLE ID |
| 8:4 | LOGICAL TABLE MASK |
| 3:0 | OTHER |

| BLOCK CONFIGURATION REGISTER | |
|---|---|
| BIT | DESCRIPTION |
| 31:10 | OTHER |
| 9 | ENC. ENABLE/DISABLE<br>0 = LP Mode Disabled<br>1 = LP Mode Enabled |
| 8:4 | LOGICAL TABLE ID |
| 3:0 | BLOCK WIDTH |

| LOGICAL TABLE REGISTER | |
|---|---|
| BIT | DESCRIPTION |
| 31:15 | OTHER |
| 14 | ENC. ENABLE/DISABLE<br>0 = LP Mode Disabled<br>1 = LP Mode Enabled |
| 13:9 | LOGICAL TABLE ID |
| 8:4 | LOGICAL TABLE MASK |
| 3:0 | OTHER |

SELECTIVE ENCODING OF DATA VALUES FOR MEMORY CELL BLOCKS

TECHNICAL FIELD

The present invention relates generally to devices having a plurality of memory cell blocks, and more particularly to devices in which the format by which data is applied or stored can vary on a block-by-block basis.

BACKGROUND OF THE INVENTION

Integrated circuit device having large numbers of memory cells can physically divide such cells into to separately accessible groups, such as blocks. In many conventional devices of this sort, data values are applied and received from such blocks according to a uniform data format convention. That is, a data value applied to (or received from) one block has the same format as that of the other blocks. One particular type of memory cell block arrangement can be those based on content addressable memory (CAM) cells.

CAM cell memory blocks can enable rapid searching operations between a received search data value (i.e., compare data value or comparand) and stored data values residing in the CAM cell blocks. In a typical CAM cell based device, during a search operation, a compare data value can be applied to multiple blocks in the same general fashion to generate search results for such blocks. For example, a typically N-bit compare data value can be applied as N compare data line pairs, where each compare data line pair can be driven to complementary values according to a corresponding bit of the compare data value. Thus, in response to N compare data values, N compare data lines can be activated. Similarly, in a typical write operation, a data value can be written into a CAM block storage location in the same general fashion, regardless of block.

U.S. Pat. No. 7,133,302 issued to Srinivasan et al. on Nov. 7, 2006 shows a low power content addressable memory. The low power CAM device of Srinivasan et al. can receive an N-bit comparand value, and in response, activate less than N compare lines within the CAM device. This can reduce power over conventional CAM arrangements.

BRIEF DESCRIPTION OF THE DRAWINGS

FIGS. 3A and 3B show one example of compare data encoding that can be included in embodiments of the invention.

FIGS. 4A to 4C show one example of address encoding that can be included in embodiments of the invention.

FIGS. 5A and 5B show one example of write data encoding and read data decoding that can be included in embodiments of the invention.

FIGS. 6A and 6B are block schematic diagrams showing another embodiment of the invention.

FIG. 7A is a block diagram showing a processor device according to an embodiment of the invention. FIG. 7B shows a configuration register set that can be included in the embodiment of FIG. 7A. FIG. 7C shows one example of a logical table register that can be included in the set of FIG. 7B. FIG. 7D shows one example of a block configuration register that can be included in the set of FIG. 7B.

DETAILED DESCRIPTION

Various embodiments of the present invention will now be described in detail with reference to a number of drawings. The embodiments include circuits and methods for selectively changing the data format (e.g., encoding) of data values applied to memory cell blocks on a block-by-block basis.

Figure 1:
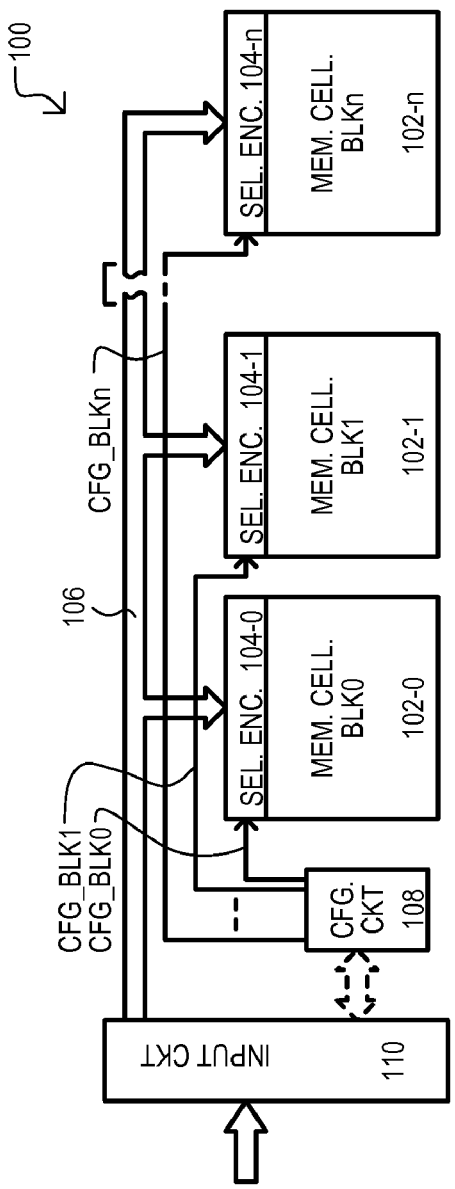
FIG. 1 is a block schematic diagram of an integrated circuit device according to a first embodiment of the invention.

Referring now to FIG. 1, an integrated circuit device according to first embodiment is shown in a block schematic diagram and designated by the general reference character 100. A device 100 can include a number of memory cell blocks 102-0 to 102-n, corresponding selective encoding circuits (104-0 104-n), a data bus 106, a configuration circuit 108, and an input circuit 110. Memory cell blocks (102-0 to 102-n) can include a number of memory cells, with each block being separately accessible for a given device operation. Preferably each memory cell block (102-0 to 102-n) can include a group of content addressable memory (CAM) cells, with each CAM cell including both storage circuits and compare circuits. In such an arrangement each separate CAM cell block can be separately searched (by applying a compare data value for comparison with stored data value), or separately written to (in order to store one or more data values in the CAM cell block), or separately read from (to output a stored data value.

Each selective encoding circuit (104-0 104-n) can be situated between data bus 106 and a different memory cell block (102-0 to 102-n). Each selective encoding circuit (104-0 104-n) can apply a data value received on data bus 106 according to a first convention, or encode such a data value according to one or more different conventions based on a received control value CFG_BLK0 to CFG_BLKn. In such an arrangement, data values received on data bus 106 can be applied in different formats to different memory cell blocks (102-0 to 102-n). As but a few examples, selective encoding circuits (104-0 104-n) can selectively encode received compare data values, or selectively encode received write data values, or even selectively encode a received address value. More detailed examples of such arrangements will be described below.

A configuration circuit 108 can control whether or not data can be encoded prior to being applied to a memory cell block (102-0 to 102-n). In the particular arrangement of FIG. 1, configuration circuit 108 can provide control values CFG_BLK0 to CFG_BLKn to selective encoding circuits 104-0 to 104-n, respectively. In one particular arrangement, configuration circuit 108 can include storage circuits that can be written to (or programmed) from outside of device 100. However, in alternate embodiments a configuration circuit 108 can be a manufacturing option, such as a metal option (enabling/disabling conductive paths according to a manufactured layer) other manufacturing configuration options such as laser fuses (fusible links opened via laser) or a bonding option, as but two examples. Control values (CFG_BLK0 to CFG_BLKn) can be single signals or multi-signal values.

An input circuit 110 can receive data values and place such values on data bus 106 for application (with or without encoding) to one or more memory cell blocks (102-0 to 102-n). Optionally, an input circuit 110 can allow control values (CFG_BLK0 to CFG_BLKn) to be written to (or programmed into) configuration circuit 108. Data values received and placed on data bus 106 can include any of compare data values, write data values, or address values. A data bus 106 can unidirectional or bi-directional It is noted that the arrangement of FIG. 1 can be conceptualized as a providing "local" data conversion, as data conversion can occur at the block level.

In this way, an integrated circuit device can alter the format in which data values are applied to memory cell blocks on a block-by-block basis.

Figure 2:
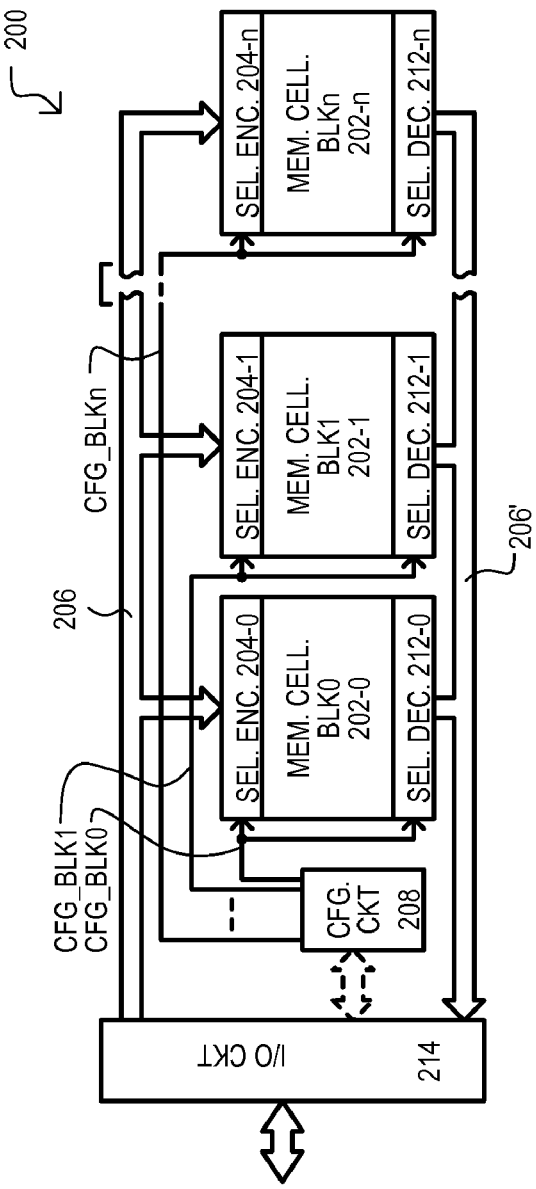
FIG. 2 is a block schematic diagram of an integrated circuit device according to another embodiment of the invention.

Referring now to FIG. 2, an integrated circuit device according to second embodiment is shown in a block schematic diagram and designated by the general reference character 200. A device 200 can include some of the same general sections as that shown in FIG. 1, thus like sections are referred to by the same reference character but with the first digit being a "2" instead of a "1".

A device 200 can differ from that of FIG. 1 in that it can include a selective decoding circuit 212-0 to 212-n corresponding to each memory cell block (202-0 to 202-n). Each selective decoding circuit (212-0 to 212-n) can be situated between data bus 206' and a different memory cell block (202-0 to 202-n). Based on a received control signal (CFG_BLK0 to CFG_BLKn), each selective decoding circuit (212-0 212-n) can receive data from the corresponding memory cell block, and output such data in the same essential manner that it is stored (i.e., not encoded) or decode such data from an encoded form into an unencoded form. In such an arrangement, the format in which data values are stored within each memory cell block (202-0 to 202-n) can vary on a block-by-block basis. As but one example, selective decoding circuits (212-0 to 212-n) can selectively decode read data values in a read operation, according to the type of data storage format of the accessed memory cell block. The data storage format for each memory cell block (202-0 to 202-n) can be indicated by a corresponding control signal (CFG_BLK0 to CFG_BLKn).

A configuration circuit 208 can provide control values CFG_BLK0 to CFG_BLKn to, the selective decoding circuits 204-0 204-n, respectively. As in the case of FIG. 1, a configuration circuit 208 can include storage circuits or can be configured with a manufacturing option.

A data bus 206' can be unidirectional or bi-directional. In the case of a bi-directional case, data bus 206' can be the same as data bus 206. In addition, a device 200 can also differ from that of FIG. 1 in that it can include an input/output (I/O) circuit 214. An I/O circuit 214 can enable data to be transferred to and from device 200.

It is noted that the arrangement of FIG. 2 can also be conceptualized as a providing "local" data conversion, as data conversion can occur at the block level.

In this way, an integrated circuit device can access data from memory cell blocks and selectively convert such data from one format to another format on a block-by-block basis.

Having described devices in which data format conversion (e.g., encoding) can occur on a block by block basis, various examples of encoding types will now be described with reference to FIG. 3A to FIG. 5B.

Referring to FIGS. 3A and 3B, a first type of encoding arrangement is shown in a block schematic diagram and table. FIGS. 3A and 3B show an arrangement in which a compare data value can be selectively encoded into a low power data format. Referring to FIG. 3A, a device 300 is shown in a block schematic diagram and includes a number of CAM cell blocks 302-0 to 302-n, corresponding compare data encoding circuits 304-0 to 304-n, and a compare data (CD) bus 306. CAM cell blocks 302-0 to 302-n can each include a number of CAM cells arranged into rows and columns that are logically arranged into groups that store data words. As but a few examples, such stored data words can include some base size (e.g., 72-bits) and include various multiples of such a base size (144, 288, or 576 bits). However, such particular sizes should not be construed as being limiting to the invention. CAM cell blocks (302-0 to 302-n) can compare an applied compare data value to multiple stored data values essentially simultaneously. Preferably, each CAM cell includes a compare circuit and corresponding storage circuit.

Each compare data encoding circuit (304-0 to 304-n) can receive a compare data values on a compare data bus 306 and apply such data values to the corresponding CAM cell block (302-0 to 302-n) in one of multiple formats. In the very particular example shown, each compare data encoding circuit (304-0 to 304-n) can apply a compare data value in "complementary" or "one-hot" format. Examples of such format are shown in FIG. 3B.

FIG. 3B shows a table illustrating one possible example of an encoding operation that can take place on portions (in this case 2-bit portions) of a compare data value. FIG. 3B includes a column "CD" that shows possible combinations for two bits of a compare data value, a column "NOT ENC." which shows a first data format (complementary) for the 2-bit CD combinations, and a column "ENC." which shows a second data format (one-hot) for the 2-bit CD combinations.

Columns "NOT ENC." and "ENC." can represent how applied compare data lines are driven in a compare operation. Thus, it is understood from FIG. 3B that in a format "NOT ENC.", for each two compare data bits, two applied compare data lines can be driven high in a compare operation (assuming both return low between compare operations). In contrast, in a format "ENC.", one applied compare data line will be driven high for each two compare data bits. Accordingly, encoding according to format "ENC." can reduce power consumed by compare data line switching by about half.

Details related to encoding compare data values are described in U.S. Pat. No. 7,133,302 issued to Srinivasan et al. on Nov. 7, 2006. The contents of this patent are incorporated by reference herein.

While the above has described an arrangement in which the format of applied compare data values can be selectively changed depending upon CAM cell block, in alternate embodiments, the format of an applied address value can also be selectively changed. One example of such an arrangement is shown in FIGS. 4A to 4C.

FIG. 4A shows a device 400 in a block schematic diagram, that can include a number of CAM cell blocks 402-0 to 402-n, corresponding address encoding circuits 404-0 to 404-n, and an address bus 406. CAM cell blocks 402-0 to 402-n can each include a number of CAM cells arranged into rows and columns, as in the case of FIG. 3A.

Each address encoding circuit (404-0 to 404-n) can receive address values on address bus 406 and apply such values to the corresponding CAM cell block (402-0 to 402-n) as word line signals in one of multiple formats. In the very particular example shown, each address encoding circuit (404-0 to 404-n) can apply word line signals in a "one-hot" or "group-hot" format. Examples of such format are shown in FIG. 4B.

FIG. 4B shows a table illustrating one possible example of an encoding operation that can take place on an address value in an arrangement like that of FIG. 4A. FIG. 4B includes a column "ADD" that shows an applied address, a column "WLs" which identifies eight word lines, a column "NOT ENC." which shows a first data format (one-hot) for the received address value (0003), and a column "ENC." which shows a second data format (group-hot) for the same received address.

Columns "NOT ENC." and "ENC." can represent how word lines are driven in a write operation. Thus, it is understood from FIG. 4B that in a format "NOT ENC.", one word line can be driven high according to a received address. This is a conventional decoding operation. In contrast, in a format "ENC.", a group of word lines can be driven high in response to an address. Such a group-hot encoding can allow one write value to be written to multiple storage locations. Even more particularly, such an arrangement can allow a single mask value to be written to a group of locations.

FIG. 4C shows one example of an address decoding circuit that can be included in an embodiment like that of FIG. 4A to allow switching between multiple data formats. In particular, FIG. 4C shows an arrangement in which a predecoded signal PDECB (a value that is active low) can be used to activate multiple word lines when a corresponding control signal ENC_ADDBi is active (low in this case). Signal PDECB can be generated in response to a decoding operation that can decode higher order address bits to identify a desired group of word lines.

While the above examples have shown arrangements for altering the formats of compare data values or address values, the format of a read and/or write values can also be selectively changed. In particular, it may be desirable to write data values into CAM cell blocks that are compatible with the compare data encoding shown in column "ENC." of FIG. 3B. Further, it may be desirable to decode data values compatible with data encoding of FIG. 3B to generate unencoded values. One example of such an arrangement is shown in FIGS. 5A and 5B.

Referring to FIG. 5A, a device 500 is shown in a block schematic diagram and includes a number of CAM cell blocks 502-0 to 502-n, corresponding data encoding circuits 504-0 to 504-n, corresponding data decoding circuits 512-0 to 512-n, and a bi-directional data bus 506. CAM cell blocks 502-0 to 502-n can each include a number of CAM cells arranged into rows and columns as in the case of FIG. 3A.

Data encoding circuits (504-0 to 504-n) can receive write data values on a data bus 506 and apply such data values to the corresponding CAM cell block (502-0 to 502-n) in one of multiple formats. In the very particular example shown, each compare data encoding circuit (504-0 to 504-n) can apply a compare data value in a "complementary" or "one-hot" format (where "complementary" and "one" hot refer to the format of an applied compare data value, and not the stored data value). Examples of such formats are shown in FIG. 5B. Data decoding circuits (512-0 to 512-n) can receive data values from a corresponding CAM cell block (502-0 to 502-n). According to a control signal (ENC_D0 to ENC_Dn), a corresponding data decoding (512-0 to 512-n) can perform a decoding operation to change from one format (e.g., one-hot) to another format (e.g., complementary), and then provide the resulting value on data bus 506. Examples of such format are also shown in FIG. 5B.

FIG. 5B shows a table illustrating one possible example of an encoding operation and decoding operation that can take place on portions (in this case 2-bit portions) of a write or read data value and its corresponding mask value. FIG. 5B includes columns "D1" and "D0" that show data bit values, as well as columns "M0" and "M1" that show mask values corresponding to the data values. FIG. 5B also shows a column "NOT ENC." which shows a first data format (complementary) for the 2-bit data/mask combinations, and a column "ENC." which shows a second data format (one-hot) for the 2-bit data/mask combinations.

It is understood that a read operation can execute the reverse of the write operation, decoding values like those shown in column "ENC." into those shown in column "NOT ENC." or "M1/D1/M0/D0".

Details related to encoding write data values and decoding read data values are also described in U.S. Pat. No. 7,133,302 issued to Srinivasan et al. on Nov. 7, 2006, referenced above.

In this way, a CAM device can provide for selective encoding of a compare data value, write data values, read data values, or address values on a block-by-block basis.

Referring now to FIGS. 6A and 6B, a device according to another embodiment is shown in a block schematic diagram and designated by the general reference character 600. FIG. 6A shows sections of device 600 that can operate in a search operation, while FIG. 6B shows sections of a device 600 that can operate in a read or write operation.

Referring to FIG. 6A, a device 600 can include some of the same general sections as FIG. 1, thus like sections are referred to by the same reference character but with the first digit being a "6" instead of a "1".

FIG. 6A can differ from that of FIG. 1 in that device 600 shows a register set 616, a data latch 618, a command decoder 620, a control circuit 622, and a table compare circuit 626. A register set 616 can include a number of registers accessible by write operations. In the example shown, register set 616 can include logical table registers 624 and block configuration registers 608. Block configuration registers 608 can store control values ENC_BLK0 to ENC_BLKn corresponding to each CAM cell block (602-0 to 602-n). These control values (ENC_BLK0 to ENC_BLKn) can dictate the format of data input to a corresponding CAM cell block (602-0 to 602-n). The block configuration registers 608 can also store a logical table identification value (LOGID_BLK0 to LOGID_BLKn) for each CAM cell block (602-0 to 602-n). These values (LOGID_BLK0 to LOGID_BLKn) can provide a logical grouping of blocks, enabling searches to be directed to logical tables that can span one or more CAM cell blocks.

Logical table registers 624 store values that can define how a search operation is be undertaken. In the very particular example shown, in response to a search command, a search table value LOGID_SRCH can be retrieved from logical table registers 624. Within a table compare circuit 626, the search table value can be compared against block logical table identification values (LOGID_BLK0 to LOGID_BLKn) for each CAM cell block. If such a comparison indicates a match, an enable signal (EN0 to ENn) can be activated that indicates if the CAM cell block is to be included in the search operation.

A data latch 618 can be used to latch incoming data to a device 600 and provide such data to data bus 606. Such data can include compare data values in a search operation. In a register write operation, such values can include register values for register set 616 as well as address values for accessing such registers (i.e., data bus 606 can be an address/data multiplexed bus).

A command decoder 620 can decode command data received by device 600 in order to indicate the type of operation to be performed. In the particular case illustrated, a command decoder 620 can decode commands that indicate searches for execution based on an entry within logical table register 624.

A control circuit 622 can provide control signals for various portions of device 600 based on timing signals (not shown) and decoded command information from command decoder 620. In the particular arrangement shown, in response to a search command, control circuit 622 can access a particular logical table register, resulting in a logical search table value LOGID_SRCH being output to table compare circuit 626.

Referring still to FIG. 6A, a device 600 can include compare data encoding circuits (628-0 to 628-n) that include an encoding path and a non-encoding path. A compare data value on data bus 606 can pass through a compare data encoder 630 or bypass such a circuit according to a control signal ENC0 to ENCn. However, this particular arrangement should not be construed as being limiting to the invention. Alternate encoding arrangements can be used in lieu of that shown in FIG. 6A.

Having described the general components of a device 600 that can be utilized in a search operation, one example of a search operation will now be described.

Referring still to FIG. 6A, in a search operation a compare data (CMP) value can be received at data latch 618. This can include an entire CMP value being received at once, or portions of a CMP value being received over consecutive time periods. Coincident with, or otherwise in relation to the CMP value, a search command can be received by command decoder 620 (shown in this example as SEARCH WITH LOGICAL TABLE REGISTER). In response to such command data, control circuit 622 can output a search logical table value LOGID_SRCH to table compare circuit 626.

Within table compare circuit 626 value LOGID_SRCH can be compared against logical table values (LOGID_BLK0 to LOGID_BLKn) for each CAM cell block (602-0 to 602-n). Such a compare operation can include maskable compares, etc. If a match is found, a corresponding enable indication EN0 to ENn can be activated, enabling the corresponding CAM cell block (602-0 to 602-n) to be searched with the received compare data value CMP.

At this time, or prior to receipt of the search command, block configuration registers 608 can provide control signals ENC_BLK0 to ENC_BLKn that can dictate how compare data encoding circuits (628-0 to 628-n) apply compare data values to their corresponding CAM cell blocks (602-0 to 602-n).

A latched CMP value can then be applied to the CAM cell blocks (602-0 to 602-n). For those CAM cell blocks that are enabled for a given search, the corresponding compare data encoding circuit (628-0 to 628-n) can apply compare data in a format indicated by the corresponding control signal ENC_BLK0 to ENC_BLKn.

In this way, a device 600 can include storage registers corresponding to each CAM cell block that can provide enable values for selecting how compare data is to be applied to the block, as well as a logical table identifier, that can indicate whether the block is to take place in a search operation.

Referring now to FIG. 6B, the same device as FIG. 6A is shown in a block schematic diagram. However, additional sections utilized in read and write operations are shown. In particular, FIG. 6B shows write data encoding circuits 632-0 to 632-n as well as read data decoding circuits 636-0 to 636-n. Like the compare data encoding circuits (628-0 to 628-n) of FIG. 6B, write data encoding circuits (632-0 to 632-n) can include an encoding path, and a non-encoding path. A write data value on data bus 606 can pass through a write data encoder 634 or bypass such a circuit according to a control signal ENC0 to ENCn. In the reverse fashion, read data decoding circuits (636-0 to 636-n) can include a decoding path, and a non-decoding path. A read data value on data bus 606 can pass through a read data decoder 638 or bypass such a circuit according to a control signal ENC0 to ENCn. Again, these particular encoding and decoding arrangements should not be construed as being limiting to the invention.

Having described the general components of a device 600 that can be utilized in a write or read operation, examples of such operations will now be described.

Referring to FIG. 6B, in a write operation a write address and write data value can be received at data latch 618. In one particular arrangement, such values can be received in multiplexed fashion. Even more particularly, address values can be initially received, and portions of such addresses can be latched by address decoders 640-0 to 640-n. Such an operation can include some predecoding of such address values (not shown). Subsequently, corresponding write data can be received. Coincident with, or otherwise in relation to the write address/data values, a write command can be received by command decoder 620. In response to such command data, control circuit 622 can output write enable value WE to CAM cell blocks (602-0 to 602-n). Such a value, in combination with the write address, can enable access to a CAM cell block at an address indicated by the received write address.

At this time, or prior to receipt of the write command, block configuration registers 608 can provide control signals ENC_BLK0 to ENC_BLKn that can dictate how write data encoding circuits (632-0 to 632-n) apply write data values to their corresponding CAM cell blocks (602-0 to 602-n). The latched write data value can then be applied to the CAM cell blocks (602-0 to 602-n). For the CAM cell blocks that is enabled for a given write, the corresponding compare data encoding circuit (632-0 to 632-n) can apply write compare data in a format indicated by the corresponding control signal ENC_BLK0 to ENC_BLKn.

Referring still to FIG. 6B, in a read operation a read address and data value can be received at data latch 618. In one particular arrangement, such values can be received in multiplexed fashion in the same general fashion as the above write operation. Coincident with, or otherwise in relation to the read address/data values, a read command can be received by command decoder 620. In response to such command data, control circuit 622 can output a read enable value RE to CAM cell blocks (602-0 to 602-n). Such a value, in combination with the read address can allow access to a CAM cell block at the address indicated by the read address.

At this time, or prior to receipt of the read command, block configuration registers 608 can provide control signals ENC_BLK0 to ENC_BLKn that can dictate how read data decoding circuits (636-0 to 636-n) operate on data output from their corresponding CAM cell blocks (602-0 to 602-n). A resulting read data value can be placed on data bus 606 and latched by data latch 618.

In this way, a device 600 can include storage registers corresponding to each CAM cell block that can provide enable values for selecting a format for data stored in the CAM cell block.

Referring now to FIG. 7A, a processor device according to an embodiment is shown in a block diagram and designated by the general reference character 700. A device 700 can include some of the same general sections as FIG. 1, thus like sections are referred to by the same reference character but with the first digit being a "7" instead of a "1". FIG. 7A differs from that of FIG. 1 in that it includes memory cell blocks divided into a number of banks. In the particular example shown, device 700 includes a first bank 742-0 that includes memory cell blocks 702-00 to 702-0n, and a second bank 742-1 that includes memory cell blocks 702-10 to 702-1n.

In addition, a configuration register set 744-0 and 744-1 can be associated with each bank (742-0 and 742-1) and can store values the dictate block and search configurations. One very particular example of a possible format for a configuration register set (744-0 and/or 744-1) is shown in FIG. 7B, and will be described in more detail below.

A data bus 706 can provide a data path between banks (742-0 and 742-1) and a data register 718, an instruction register 746, and a result bus register 748. In one particular arrangement, data register 706 can store incoming compare data values, incoming write data values (both to memory cell blocks and registers), incoming address values, and outgoing read data values. An instruction register 746 can store a received instruction for subsequent decoding. A result register 748 can store a result value output from each bank (742-0 and 742-1) generated in response to a search command.

Referring to FIG. 7B one particular example of configuration register set is shown in table format. The configuration register set of FIG. 7B can be included in register sets (744-0 and 744-1) shown in FIG. 7A. As shown, there can a number of logical table registers for each bank (in this particular example 32 registers accessible at addresses 005F(hex) to 0040(hex)). In addition, for each bank there can be a block configuration register for each block of the bank (in this particular example, 16 blocks per bank). One particular example of a logical table register is shown in FIG. 7C. One particular example of a block configuration register is shown in FIG. 7D.

Referring to FIG. 7C, an exemplary logical table register entry can include a number of fields, including a logical table ID field and a logical table ID mask field. A logical table ID field can identify blocks to be accessed in a search operation. In particular, a value stored in the logical table ID field can be compared against logical table IDs corresponding to each memory cell block. A logical table ID mask can allow masking of logic table ID value bits in such a compare operation. Fields indicated as "OTHER" can provide additional information, or can be reserved for other purposes.

Referring to FIG. 7D, an exemplary a block configuration register entry can include an encoding field (ENC. ENABLE/DISABLE), a logical table ID field, and a block width field. An encoding field can indicate whether the corresponding memory cell block should include an encoding operation. Such a value can be used to generate control signals for encoding and/or decoding circuits. A logical table ID field can be compared against a similar value in a logical table register accessed by a search operation. Such a comparison can determine if the memory cell block is to be included in the search operation. A width field can indicate a logical grouping of data values in a memory cell block. As in the case of FIG. 7C, the field indicated as "OTHER" can provide additional information, or be reserved for other purposes.

In this way, a device can include a register set that includes both logical table register that can identify which memory cell blocks are included in a search operation, as well as block configuration registers that can allow data to be encoded into any of a multiple formats prior to being applied to the block.

While embodiments above have shown arrangement that utilize local data conversion, alternate embodiments can include "global" data conversion. One such arrangement is shown in FIG. 8.

Figures 8, 10:
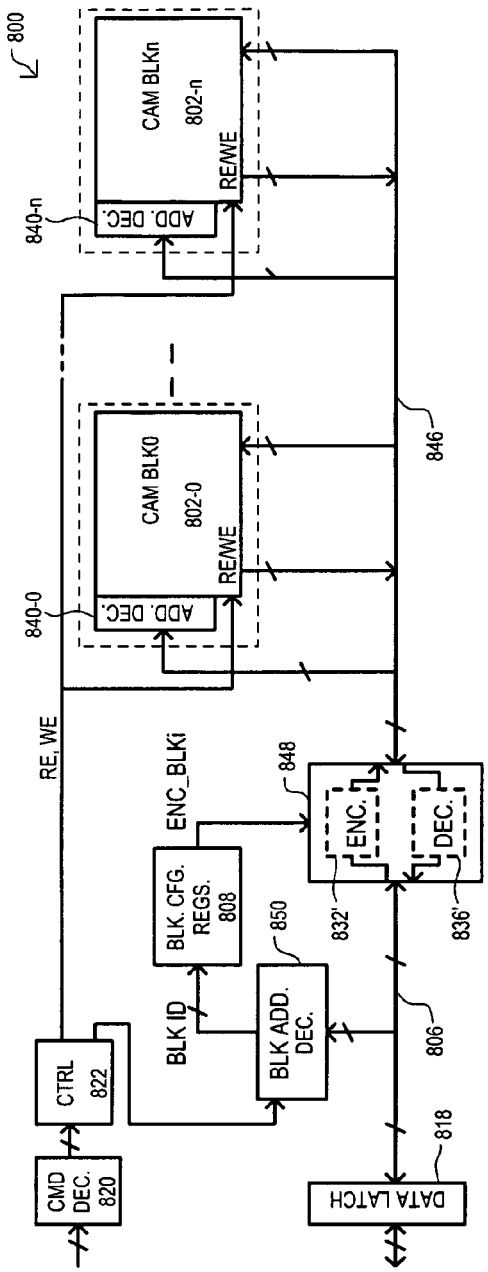
FIG. 8 is a block schematic diagram showing another embodiment of the invention.
FIG. 10 shows one example of a logical table register that can be included in the embodiment of FIGS. 9A and 9B.

Referring to FIG. 8, a device according to another embodiment is shown in a block schematic diagram and designated by the general reference character 800. A device 800 can include some of the same general sections as FIG. 6B, thus like sections are referred to by the same reference character but with the first digit being an "8" instead of a "6".

FIG. 8 differs from FIG. 6B in that a write data encoding circuit or read data encoding circuit is not provided for each CAM cell block (802-0 to 802-n). Instead, CAM cell blocks (802-0 to 802-n) are commonly connected to global encoding/decoding circuit 848 by a block data bus 846.

FIG. 8 also differs from FIG. 6B in that it can include a block address decoder 850. A block decoder 850 can generate a block identification value BLK ID based on a portion of a received address. Such a block identification value can serve as an index to a block configuration registers 808. In response to a BLK ID value, block configuration registers 808 can output a control value corresponding to an encoding state ENC_BLKi of the block. Such a control value can control the operation of global encoding circuit 848.

Having described the general components of device 800 that can be utilized in a write or read operation, examples of such operations will now be described.

Referring to FIG. 8, in a write operation, a write address and write data value can be received at data latch 818. As but one example, an address value can be initially received and allowed to pass through global encoder/decoder circuit 848 and latched by address decoders 840-0 to 840-n. In addition, part of such an address can be decoded by block address decoder 850 to identify the memory cell block to which data is to be written. Such a block ID value can be used to access the block configuration register 808 to determine if data should be encoded for the block. Configuration register 808 can provide value ENC_BLKi, which indicates if encoding is to take place.

Subsequently, corresponding write data can be received. At this time, global encoding/decoding circuit 848 can be configured according to value ENC_BLKi. Thus, if a block is to have encoded data, a global encoder path 832' can encode such data and place it on block data bus 846. Conversely, if a block is not to have encoded data, a global encoder path 832' can place such data onto block data bus 846 without encoding.

Coincident with, or otherwise in relation to the write address/data values, a write command can be received by command decoder 820. In response to such command data, control circuit 822 can output write enable value WE to CAM cell blocks (802-0 to 802-n). Such a value, in combination with the write address, can enable the data value on block data bus 846 to be written into the appropriate CAM cell block.

Referring still to FIG. 8, in a read operation a read address and data value can be received at data latch 818. In one particular arrangement, such values can be received in multiplexed fashion in the same general fashion as the above write operation. Coincident with, or otherwise in relation to the read address/data values, a read command can be received by command decoder 820. In response to such command data, control circuit 822 can output a read enable value RE to CAM cell blocks (802-0 to 802-n). Such a value, in combination with the read address can result in a read data value being placed onto block data bus 846. Such a value may be encoded or may not be encoded.

At this time, or prior to receipt of the read command, block configuration registers 808 can provide control signal ENC_BLKi in response to the read address to dictate how a global decoding circuit 836' is to function. That is, if value ENC_BLKi indicates encoding for the memory cell block, global decoding circuit 836' can perform a decoding operation on data present on block data bus 846, and output such decoded data on data bus 806. Conversely, if value ENC_BLKi indicates no encoding for the memory cell block, global decoding circuit 836' will pass data present on block data bus 846 to data bus 806 without a decoding operation.

In this way, encoding and/or decoding can be performed on a block-by-block basis, but with a shared global encoder or decoder, rather than local encoders/decoders.

While the above embodiments have shown examples in which encoding (e.g., format changing) operations can be performed on a block-by-block basis, other embodiments can execute such operations along logical boundaries, such as logical tables that can span one or more blocks. One such arrangement is shown in FIGS. 9A and 9B.

Figure 9A:
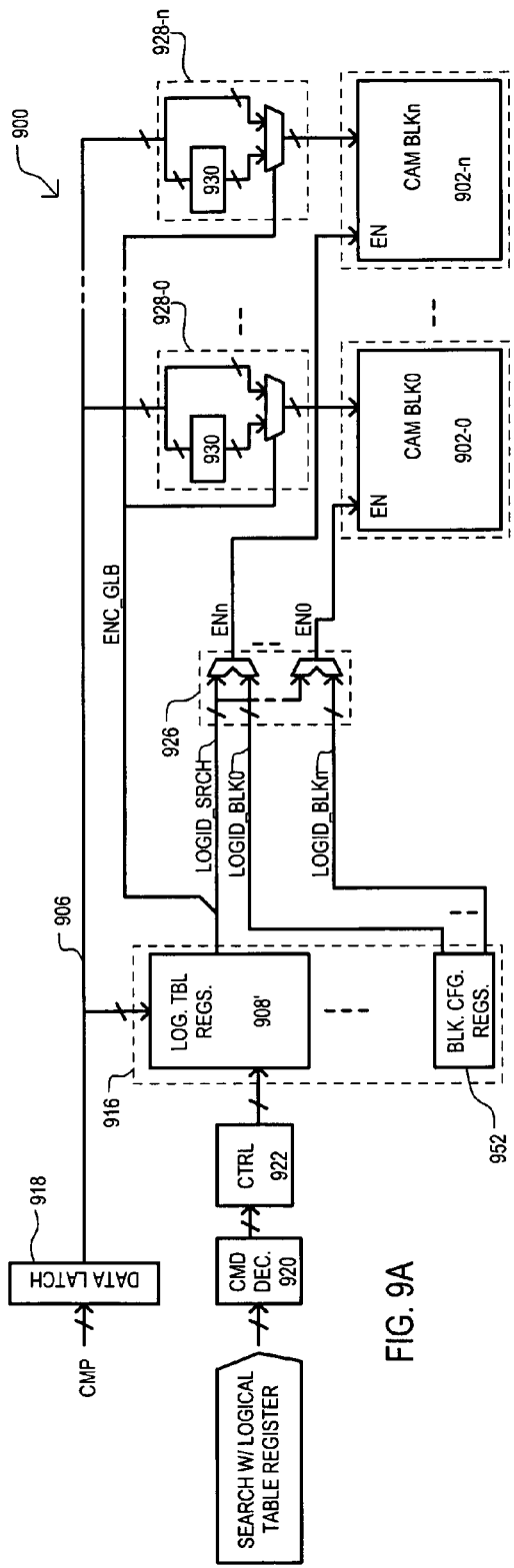
FIGS. 9A and 9B are block schematic diagrams showing yet another embodiment of the invention.
Figure 9B:
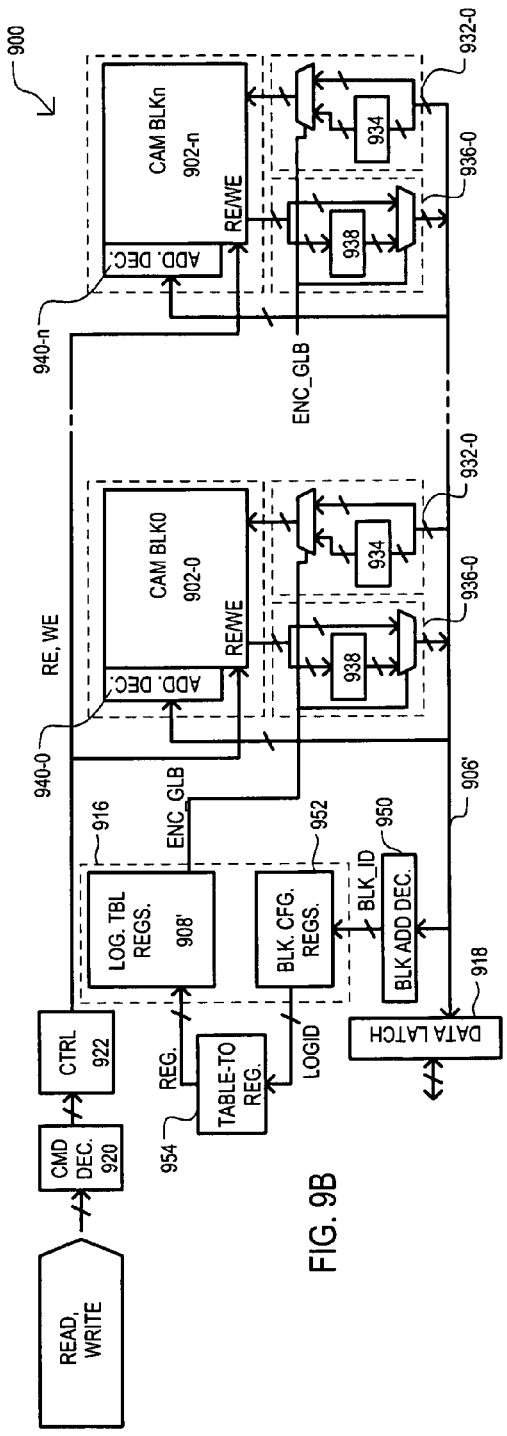

Referring now to FIGS. 9A and 9B, a device according to another embodiment is shown in a block schematic diagram and designated by the general reference character 900. FIG. 9A shows sections of device 900 that can operate in a search operation, while FIG. 9B shows sections of a device 900 that can operate in a read or write operation.

Referring to FIG. 9A, a device 900 can include some of the same general sections as FIG. 6A, thus like sections are referred to by the same reference character but with the first digit being a "9" instead of a "6".

FIG. 9A can differ from that of FIG. 1 in that logical table registers can serve as configuration registers 908' with respect to encoding operations, and encoding can be performed on the basis of a logical table, rather than a physical block. Thus, FIG. 9A shows a block configuration register 952, however it is understood that these registers do not control whether data encoding is performed, as such values are contained in logical table registers as noted above.

Having described the general components of a device 900 that can be utilized in a search operation, one example of a search operation will now be described.

Like the arrangement of FIG. 6A, in the embodiment of FIG. 9A, in a search operation a compare data (CMP) value can be received at data latch 918. Coincident with, or otherwise in relation to the CMP value, a search command can be received by command decoder 920. In response to such command data, control circuit 922 can output a search logical table value LOGID_SRCH to table compare circuit 926. However, unlike FIG. 6A, accessing such register results in the generation of a global encoding value ENC_GLB corresponding to the register entry in conjunction with a logical table value LOGID_SRCH. The global encoding value ENC_GLB can be applied to compare data encoding circuits 928-0 and 928-n.

A table compare circuit 926 can operate in the same general fashion as FIG. 6A, enabling selected CAM cell blocks (902-0 to 902-n) for inclusion in the search operation.

A latched CMP value can then be applied to the CAM cell blocks (902-0 to 902-n). For those CAM cell blocks that are enabled for a given search, the corresponding compare data encoding circuit (928-0 to 928-n) can apply compare data in a format indicated by the global control signal ENC_GLB.

In this way, a device 900 can include storage registers that determine how data can be applied to multiple CAM cell blocks based on a logical arrangement of such blocks, and not the physical arrangement of such blocks.

Referring now to FIG. 9B, the same device as FIG. 9A is shown in a block schematic diagram. However, additional sections utilized in read and write operations are shown. In particular, FIG. 9B shows a block address decoder 950 and a table-to-register lookup circuit 954. A block address decoder circuit 950 can operate in the same fashion as that shown as 850 in FIG. 8. A value (BLK ID) generated by block address decoder circuit 950 can be provided to block configuration register 952. In response, block configuration register 952 can provide the logical table identification value (LOGID) corresponding to the CAM cell block being accessed. This table value can be applied to table-to-register lookup circuit 954, which can provide a register address corresponding to the logical table. Such a register address can be applied to logical table register 908' to generate the global encoding value ENC_GLB for the table.

Having described the general components of a device 900 that can be utilized in a write or read operation, examples of such operations will now be described.

Referring to FIG. 9B, in a write operation a write address and write data value can be received at data latch 918. Address values can be applied to address decoders 940-0 to 940-n in CAM cell blocks (902-0 to 902-n). In addition, at least a portion of such an address can be decoded by block address decoder 950 to generate a block ID value. This value can be utilized to generate a global encoding value ENC_GLB by operation of block configuration registers 952, table-to-register lookup circuit 954, and logical table register 908', in the manner noted above.

Coincident with, or otherwise in relation to the write address/data values, a write command can be received by command decoder 920. In response to such command data, control circuit 922 can output write enable value WE to CAM cell blocks (902-0 to 902-n). Such a value, in combination with the write address can enable access to a CAM cell block at an address indicated by the received write address.

The latched write data value can then be applied to the CAM cell blocks (902-0 to 902-n). For the CAM cell blocks that is enabled for a given write, the corresponding compare data encoding circuit (932-0 to 932-n) can apply write compare data in a format indicated by the global control signal ENC_GLB.

Referring still to FIG. 9B, in a read operation, a read address and data value can be received at data latch 918. By operation of block address decoder 950, block configuration registers 952, table-to-register lookup circuit 954, and logical table register 908', a global control signal ENC_GLB can be generated that corresponds to the logical table being read from.

The global control signal ENC_GLB can dictate how read data decoding circuits (936-0 to 936-n) operate on data read from their corresponding CAM cell blocks (902-0 to 902-n). A resulting read data value can be placed on data bus 906 and latched by data latch 918.

In this way, a device 900 can include storage registers corresponding the logical organization of CAM cell block that can select a format for data stored in the CAM cell blocks.

Referring now to FIG. 10, one example of an entry that can be included logical table register 908' is shown in a table form. The entry includes the same general fields as that shown in FIG. 7C, however, the entry further includes an encoding field (ENC. ENABLE/DISABLE) that can indicate whether searches and values corresponding to the logical table should include an encoding operation (for searches and writes) or a decoding operation (for reads).

It is understood that the embodiments of the invention may be practiced in the absence of an element and or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. An integrated circuit device, comprising:
   a plurality of configuration storage locations each comprising at least one encoding field that selectively enables at least one received data value to be encoded into an encoded data value prior to being applied to a corresponding block of the integrated circuit device, and a logical table field that provides a logical table identification value for the corresponding block; and each block comprising a plurality of content addressable memory (CAM) cells and being enabled in a search operation based upon at least the logical table identification value corresponding to the block.

2. The integrated circuit device of claim 1, wherein:
the at least one received data value comprises a compare data value that is compared to data values stored in locations of at least one block.

3. The integrated circuit device of claim 2, wherein:
the compare data value is encoded according to at least a "one hot" encoding in which each possible combination of N compare data bit values is encoded into different $2^N$-bit applied compare data values, where each $2^N$-bit applied compare data value has only one bit that differs from the other bits of the same value, and where N>1.

4. The integrated circuit device of claim 1, wherein:
the at least one received data value comprises at least a stored data value that is stored within the block and compared with compare data values in a search operation.

5. The integrated circuit device of claim 4, wherein:
the stored data value is encoded according to at least a "one hot" encoding in which each possible combination of N compare data bit values is encoded into different $2^N$-bit encoded stored data values, where each $2^N$-bit encoded stored data value has only one bit that differs from the other bits of the same value, and where N>1.

6. The integrated circuit device of claim 4, wherein:
the at least one received data value comprises a combination of a stored data value and corresponding mask value.

7. The integrated circuit device of claim 1, wherein:
the at least one received data value comprises an address value.

8. The integrated circuit of claim 7, wherein:
the address value is encoded to activate multiple word lines in response to the address value.

9. The integrated circuit of claim 1, further including:
a data bus; and
each block further comprises an encoding circuit coupled between the data bus and the corresponding plurality of CAM cells, each encoding circuit selectively providing at least one encoding function based on a corresponding encoding field.

10. The integrated circuit of claim 1, wherein:
each encoding field further selectively enables at least one data value output from the corresponding block to be decoded from a stored encoded data value into an unencoded read data value.

11. The integrated circuit of claim 10, further including:
a data bus; and
each block further comprises a decoding circuit coupled between the data bus and the corresponding plurality of CAM cells, each decoding circuit providing one of a plurality of decoding functions based on the corresponding encoding type field.

12. The integrated circuit of claim 10, further including:
a data bus; and
a global decoding circuit coupled between the data bus and a plurality of blocks, the global decoding circuit providing one of a plurality of decoding functions based on a selected encoding field.

13. The integrated circuit of claim 12, further including:
a block decoder that generates a block identification value according to a received address value, the block identification value accessing the encoding field of the corresponding block.

14. The integrated circuit device of claim 1, wherein:
a logical table register having a plurality of locations that store search table identification values; and
each block is enabled in a search operation based upon a comparison between a search table identification value accessed from the logical table register and the logical table identification value corresponding to the block.

15. A method of applying data values to blocks of a memory device, each block comprising content addressable memory (CAM) cells, comprising the steps of:
providing a separate configuration value and logical table value for each block;
receiving a data value for application to at least one block of the memory device;
if the configuration value for the block indicates an encoding operation, encoding the data value prior to applying it to the block;
if the configuration value for the block does not indicate an encoding operation, applying the data value to the block without encoding the data value; and
enabling access to each block based on the logical table value of the block.

16. The method of claim 15, wherein:
the step of receiving a data value includes receiving a compare data value for comparison with stored data values stored in the at least one block; and
encoding the data value prior to applying it to the block includes encoding the compare data value into an applied compare data value that consumes less power when driving compare data lines than a corresponding applied compare data value without encoding.

17. The method of claim 15, further including:
the step of receiving a data value includes receiving a write data value for storage in the at least one block.

18. The method of claim 15, further including:
accessing a stored data value stored in the at least one block of the memory device;
if a configuration value for the block indicates an encoding operation, decoding the stored data value prior to outputting it from the memory device;
if the configuration value for the block does not indicate an encoding operation, outputting the stored data value from the device without decoding the stored data value.

19. An integrated circuit device, comprising:
storing means for storing configuration values and logical table values for each of a plurality of content addressable memory (CAM) blocks; and
encoding means for selectively encoding data values prior to applying such data values to a CAM block according to the configuration value for the CAM block; and
access means for selectively accessing each CAM block based on the logical table value for the CAM block.

20. The method of claim 19, wherein:
the encoding means encodes of N bits of a received compared data value into $2^N$-bit applied compare data values, where each $2^N$-bit applied compare data value has only one bit that differs from the other bits of the same value, and where N>1.

21. The method of claim 19, wherein:
the encoding means encodes write data values.

* * * * *